United States Patent
Linzer

(10) Patent No.: US 7,685,484 B2
(45) Date of Patent: Mar. 23, 2010

(54) METHODS FOR THE SUPPORT OF JTAG FOR SOURCE SYNCHRONOUS INTERFACES

(75) Inventor: Harry I. Linzer, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 198 days.

(21) Appl. No.: 11/939,751

(22) Filed: Nov. 14, 2007

(65) Prior Publication Data

US 2009/0125748 A1   May 14, 2009

(51) Int. Cl.
   *G01R 31/28* (2006.01)
(52) U.S. Cl. .................................................... 714/724
(58) Field of Classification Search .................. None
   See application file for complete search history.

(56) References Cited

U.S. PATENT DOCUMENTS

| | | | | |
|---|---|---|---|---|
| 5,048,021 A | | 9/1991 | Jarwala et al. | |
| 5,281,864 A | * | 1/1994 | Hahn et al. | 327/202 |
| 5,355,369 A | * | 10/1994 | Greenberger et al. | 714/727 |
| 5,682,391 A | * | 10/1997 | Narayanan | 714/731 |
| 6,681,359 B1 | | 1/2004 | Au et al. | |
| 6,813,738 B2 | | 11/2004 | Whetsel, Jr. | |
| 7,213,183 B2 | | 5/2007 | Gossmann | |
| 7,234,091 B2 | * | 6/2007 | Liang | 714/727 |
| 7,284,174 B2 | | 10/2007 | Dubey | |

* cited by examiner

*Primary Examiner*—Christine T Tu
(74) *Attorney, Agent, or Firm*—Cantor Colburn LLP; Mark McBurney

(57) ABSTRACT

Exemplary embodiments of the present invention comprise a method for the support of a JTAG interface for the testing of connectivity between integrated circuits. The method comprises delivering output from a JTAG register to a primary register, delivering a JTAG control signal to the primary register and a clock signal gating control logic, delivering output from the primary register and a secondary register to a multiplexer, delivering clock signal output from the clock signal gating control logic to the multiplexer, wherein the clock signal is delivered is a constant and known value, and delivering the output from the multiplexer to an I/O driver.

1 Claim, 3 Drawing Sheets

METHODS FOR THE SUPPORT OF JTAG FOR SOURCE SYNCHRONOUS INTERFACES

BACKGROUND OF THE INVENTION

1. Field of the Invention

This invention relates to a Joint Test Action Group interface, and particularly to the implementation of the Joint Test Action Group interface in conjunction with source synchronous interfaces.

2. Description of Background

Joint Test Action Group (JTAG) is the name given to the IEEE 1149.1 standard for the interface enabled testing of the connectivity between sub-blocks of integrated circuits (ICs) contained within printed circuit boards by way of boundary scanning. A conventional architecture for implementing a JTAG structural configuration 100 is shown in FIG. 1. As shown in FIG. 1, within a source synchronous interface (e.g., such as DDR memory) the multiplexer 120 adds delay to the path between the I/O driver 125 and the functional register 110 and the JTAG register 105.

Generally, for interfaces such as memory, there are often many of the structures of FIG. 1 built in parallel in order to construct a bussed signal. Within such interfaces, skew between the outputs needs to be minimized in order to maximize system level timing margins. Further, manufacturing variation between the many multiplexers will introduce undesired skew between the signals in the bus which will limit the maximum clock rate that can be used on this interface.

SUMMARY OF THE INVENTION

The shortcomings of the prior art are overcome and additional advantages are provided through the provision of a method for the support of a JTAG interface for the testing of connectivity between integrated circuits. The method comprises delivering output from a JTAG register to a primary register, delivering a JTAG control signal to the primary register and a clock signal gating control logic, delivering output from the primary register and a secondary register to a multiplexer, delivering clock signal output from the clock signal gating control logic to the multiplexer, wherein the clock signal is delivered is a constant and known value, and delivering the output from the multiplexer to an I/O driver.

A further method comprises delivering output from a JTAG register to a primary register and a secondary register, delivering a JTAG control signal to the primary register and the secondary register, delivering output from the primary register and the secondary register to a multiplexer, delivering a clock signal to the multiplexer, wherein the clock signal is a stable but unknown value, and delivering the output from the multiplexer to an I/O driver.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

One or more exemplary embodiments of the invention are described below in detail. The disclosed embodiments are intended to be illustrative only since numerous modifications and variations therein will be apparent to those of ordinary skill in the art.

Within some ASIC libraries (such as those which implement the Level Sensitive Scan Design (LSSD) methodology) a path is often provided through a register block 110, wherein the path is normally only utilized during chip manufacturing test where the path is configured to pass the input to the path within the register to the output of the path out of the register. Within exemplary embodiments of the present invention this structural path is exploited to accomplish the objectives of the exemplary embodiments of the present invention.

Figure 2:
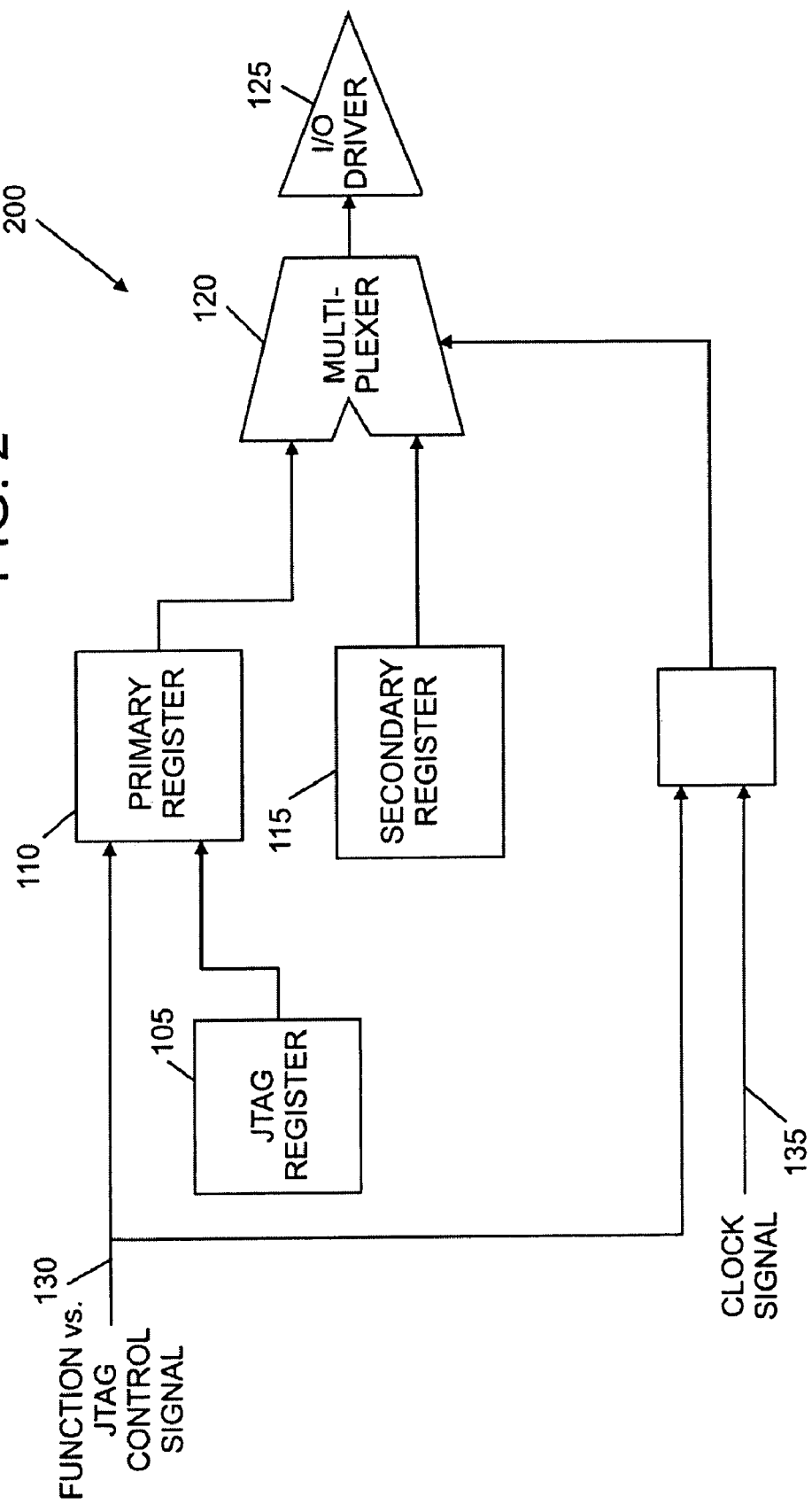
FIG. 2 illustrates one example of a JTAG structure in combination with clock gate control logic in accordance with exemplary embodiments of the present invention.
Figure 3:
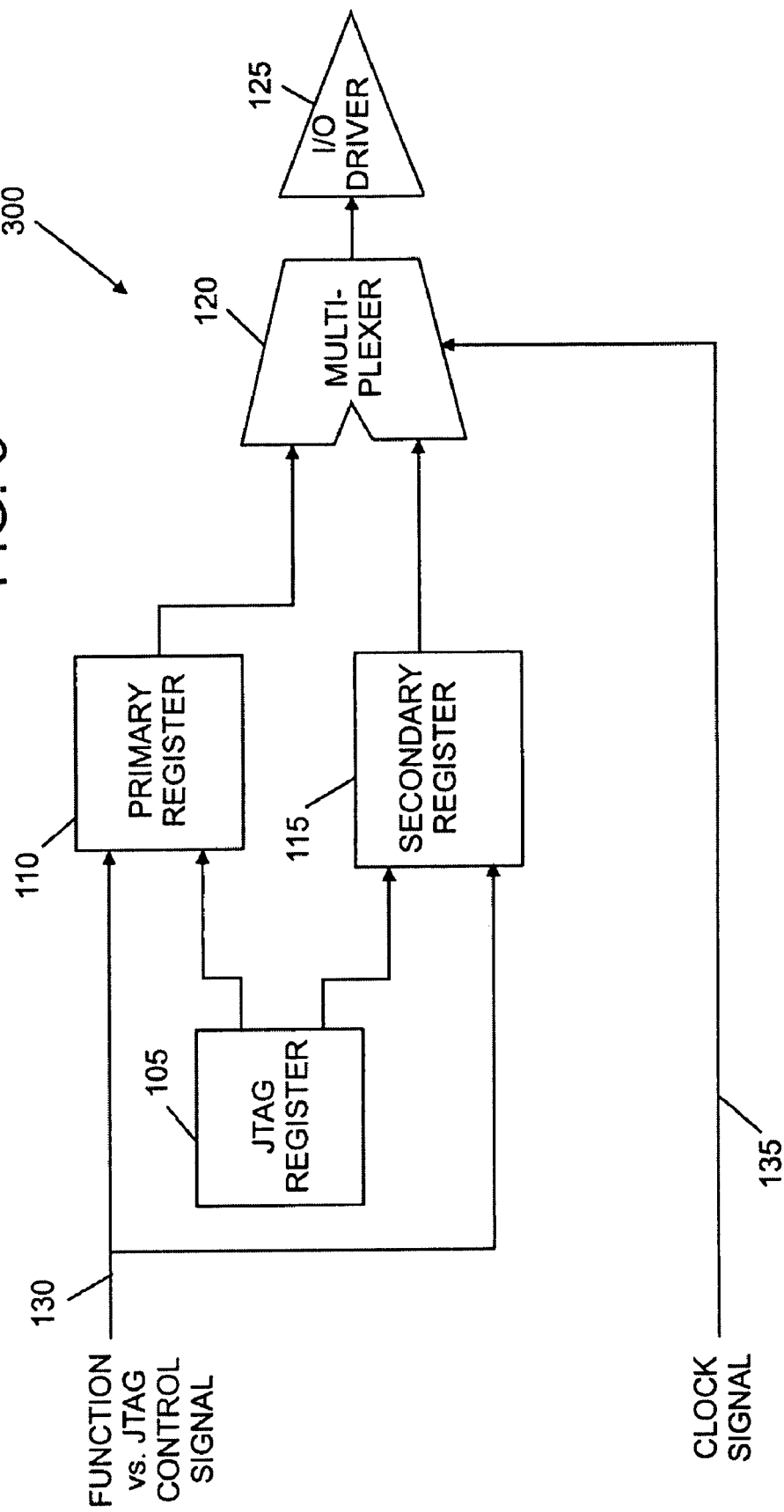
FIG. 3 illustrates one example of a JTAG structure in combination with a clock signal in accordance with exemplary embodiments of the present invention.

As shown in FIGS. 2 and 3 a "Function vs. JTAG" control signal 130 is provided within JTAG structures 200 and 300 wherein the signal 130 utilizes the fore-mentioned path through the primary register 110 in order to disable the normal operational functions of the primary register 110 and enable the path to operate in accordance with the JTAG register 105 that is attached to the primary register 110.

For write data paths as implemented within DDR memories, a different value is driven by an I/O driver during a high and low period of a clock. The state of a clock signal is normally unknown during JTAG testing, however, within exemplary embodiments of the present invention clock gating control logic 140 is implemented in order to force the clock signal 135 to a known value as so that the operational path through the multiplexer 120 will be known (FIG. 2). The clock gating control logic 140 is used in conjunction with the Function vs. JTAG control signal 130 to force the clock 135 to a constant known value state.

The precise method of achieving this constant known value should be done in a manner that causes the minimum disturbance to the clocking signal 135. In most instances, this clock gating control logic 140 can exploit logic that is necessary to facilitate the testing of the clock net, wherein this aspect can be accomplished with either no added delay or with trivial amounts of added delay. Further, the Functional vs. JTAG control signal 130 will typically be the logical OR of decode of applicable JTAG instructions that are provided by a JTAG TAP controller (not shown). The JTAG register 105 can be linked to either the primary or secondary registers 110, 115 depending on the whether a constant known state value of the clock gating control logic 140 is 0 or 1. The signal delivered by the multiplexer 120 is thereafter delivered to the I/O driver 125.

Figure 1:
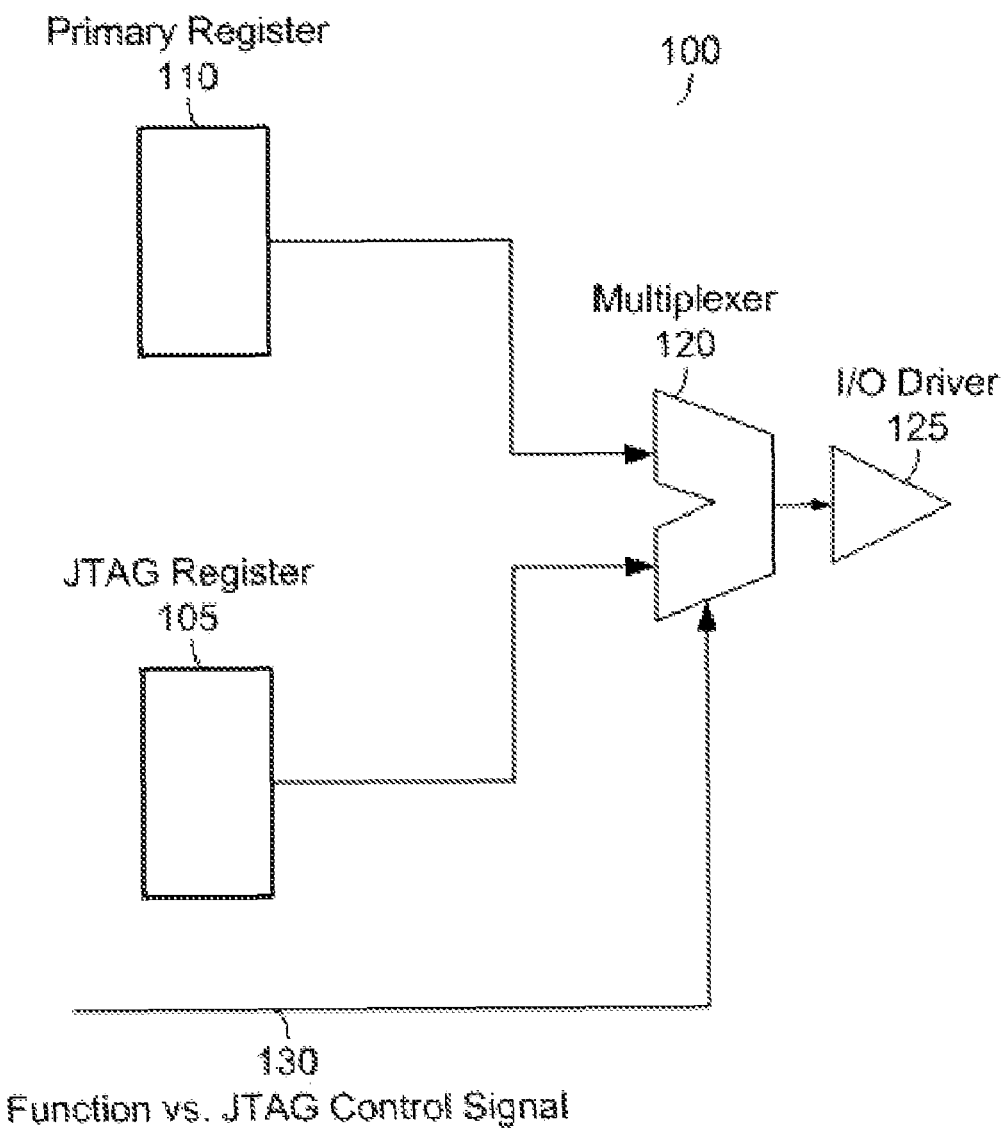
FIG. 1 illustrates one example of a prior art JTAG structure for signal output.

FIG. 3 shows a further exemplary embodiment of the present invention. In this exemplary embodiment the JTAG register 105 is concurrently linked to the primary register 110 and the secondary register 115. Further, the Function vs. JTAG control signal 130 is fed to both the primary register 110 and the secondary register 115. Within this exemplary JTAG structure, it is simply required that the clock 135 be at a stable state even though the clock 135 may have an unknown value during JTAG testing. Lastly, the signal delivered by the multiplexer 120 is thereafter delivered to the I/O driver 125. Again, this exemplary embodiment is superior to the conventional JTAG structure of FIG. 1 in such that the JTAG structure of FIG. 1 the clock gating cannot be implemented with zero timing impact.

One or more aspects of the present invention can be included in an article of manufacture having, for instance, computer usable media. The media has embodied therein, for instance, computer readable program code means for providing and facilitating the capabilities of the present invention. The article of manufacture can be included as a part of a computer system or sold separately.

The diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for the support of a JTAG interface for the testing of connectivity between integrated circuits, the method comprising:

delivering output from a JTAG register to a primary register and a secondary register of the integrated circuits;

delivering a JTAG control signal to the primary register and the secondary register, wherein the JTAG control signal is a logical OR value of decoded JTAG boundary scan connectivity instructions provided from a JTAG TAP controller in communication with the primary register and the secondary register;

delivering output from the primary register and the secondary register to a multiplexer;

delivering a clock signal to the multiplexer, wherein the clock signal is a stable but unknown value; and delivering the output from the multiplexer to an I/O driver.

* * * * *